United States Patent [19]

Devaney

[11] Patent Number: 4,684,761
[45] Date of Patent: Aug. 4, 1987

[54] METHOD FOR MAKING GRADED I-III-VI$_2$ SEMICONDUCTORS AND SOLAR CELL OBTAINED THEREBY

[75] Inventor: Walter E. Devaney, Seattle, Wash.

[73] Assignee: The Boeing Company, Seattle, Wash.

[21] Appl. No.: 850,461

[22] Filed: Apr. 9, 1986

[51] Int. Cl.$^4$ .................. H01L 31/06; H01L 31/18
[52] U.S. Cl. ........................ 136/258; 136/260; 136/264; 136/265; 427/51; 427/76; 427/255.2; 357/16; 357/30; 357/59; 357/61; 437/81; 437/2
[58] Field of Search ................ 29/572; 148/174; 427/51, 74, 76, 87, 255.2; 136/258 PC, 260, 264, 265; 357/30, 16, 59 D, 61

[56] References Cited

U.S. PATENT DOCUMENTS 4,335,266  6/1982  Mickelsen et al. ............... 136/260
4,523,051  6/1985  Mickelsen et al. ............... 136/260

OTHER PUBLICATIONS

L. Stolt et al., *Proceedings 6th E.C. Photovoltaic Solar Energy Conf.* (1985), Reidel Pub. Co. (1985), pp. 850-855.

R. W. Birkmire et al., *Solar Cells*, vol. 16, pp. 419-427 (1986).
R. Noufi et al., *J. Appl. Phys.*, vol. 58, pp. 3884-3887 (1985).
A. Hermann et al., *Proceedings SPIE*, vol. 407, Apr. 1983, pp. 96-105.
R. Noufi et al., *Conf. Record, 17th IEEE Photovoltaic Specialists conference* (1984), pp. 927-932.
R. A. Mickelsen et al., *IEEE Trans. Electron Devices*, vol. ED-31, May 1984, pp. 542-546.

*Primary Examiner*—Aaron Weisstuch
*Attorney, Agent, or Firm*—John C. Hammar

[57] ABSTRACT

Improved cell photovoltaic conversion efficiencies are obtained by the simultaneous elemental reactive evaporation process of Mickelsen and Chen for making semiconductors by closer control of the evaporation rates and substrate temperature during formation of the near contact, bulk, and near junction regions of a graded I-III-VI$_2$, thin film, semiconductor, such as CuInSe$_2$/(Zn,Cd)S or another I-III-VI$_2$/II-VI heterojunction.

60 Claims, 1 Drawing Figure

METHOD FOR MAKING GRADED I-III-VI$_2$ SEMICONDUCTORS AND SOLAR CELL OBTAINED THEREBY

The Government has rights in this invention pursuant to Contract No. ZL-4-04068-1 awarded by SERI of the Department of Energy.

TECHNICAL FIELD

The present invention relates to an improved method for making I-III-VI$_2$ semiconductors, such as CuInSe$_2$, and I-III-VI$_2$/II-VI heterojunctions and solar cells obtained thereby.

BACKGROUND ART

In U.S. Pat. Nos. Re. 31,968 and 4,523,051 (incorporated herein by reference), Michelsen and Chen disclose methods of making graded I-III-VI$_2$ semiconductors having internal p-n type regions formed by controlling the evaporation of the elements in the ternary compound so as to form a graded resistivity caused by a graded composition in the semiconductor. For example, a graded CuInSe$_2$ thin film semiconductor could be formed with two distinct regions: a copper-rich p-type region near a base contact, and a copper-deficient n-type region near the photoactive junction of the thin film. The cells that Mickelsen and Chen produced have photovoltaic conversion efficiencies approaching 10%. Surprisingly efficient cells can be made by optimizing the production process.

SUMMARY OF THE INVENTION

By providing closer control of the elemental evaporation rates, and the substrate temperature particularly in the regions of the I-III-VI$_2$ semiconductor near the contact and near the photoactive junction, higher cell efficiencies are achievable. Efficiencies as high as 11.9% AM1 (10.4% AM0) have been measured for CuInSe$_2$/(Cd,Zn)S on alumina.

Basically, the method of Michelsen and Chen is used, except that the evaporation or deposition rates are rigidly controlled during the deposition of three regions on the graded I-III-VI$_2$ semiconductor. For a CuInSe$_2$ film deposited on an alumina substrate, the evaporation rates preferably are:

| | Cu evaporation rate: |
|---|---|
| first region: | 1.64 × 10$^{-7}$ gm/cm$^2$*sec |
| second region | 1.64 × 10$^{-7}$ gm/cm$^2$*sec |
| third region: | 1.10 × 10$^{-7}$ gm/cm$^2$*sec |
| | Indium evaporation rate: |
| all regions: | 2.83 × 10$^{-7}$ gm/cm$^2$*sec |
| | Selenium evaporation rate: |
| first region: | 6.2 × 10$^{-7}$ gm/cm$^2$*sec |
| second region: | 5.7 × 10$^{-7}$ gm/cm$^2$*sec |
| third region: | 5.7 × 10$^{-7}$ gm/cm$^2$*sec |

For purposes of this description, the evaporation rate for an element is defined as the flux of that element at the substrate or thin film. The ratio of the fluxes, rather than the absolute value of those fluxes, is an important control constraint in the preparation of high efficiency thin films.

The CuInSe$_2$ thin film is preferably deposited over a forty minute cycle split into three regions or stages of 1 minute, 25 minutes, and 14 minutes. During the first two stages, the substrate temperature preferably is maintained at about 355° C.

During the third stage the temperature measured at the substrate is adjusted from 355° C. to 455° C. High efficiency solar cells have been produced using a temperature profile during this third stage of 1 minute at 355° C., linearly increasing the temperature at a rate of about 33.3° C./min for 3 minutes, and holding the temperature at about 455° C. for the remaining 10 minutes, although other heating profiles are possible.

Preferably the grid metalization atop the cell is carefully deposited to form a thin, uniform grid layer sufficiently thick to eliminate resistive losses in the metalization. Accordingly, for aluminum metalization on CuInSe$_2$, the layer should be about 5.0+/−0.5 micrometers thick.

Particularly preferred I-III-VI$_2$ solar cells for space applications are prepared on titanium foil substrates using the optimized method of the present invention.

While increased efficiencies appear to arise primarily from the optimizing of the metalization and I-III-VI$_2$ film, in the heterojunctions of the present invention (particularly for (Zn,Cd)S/CuInSe$_2$ thin film solar cells), the upper semiconductor is optimized to enhance reproducibility in production by including a ratio of Zn:Cd in the film of about 0.2+/−0.05:0.80+/−0.05. Indium doping is deliberately avoided during about the first 0.4 micrometers of the upper film, while the remainer of the film includes sufficient indium doping to yield a sheet resistance of about 20–25 ohms/square (the maximum permissible sulfide resistance for the grid metallization used in the cell).

Thin film I-III-VI$_2$ semiconductors have also been prepared at nearly as high conversion efficiencies by depositing the film in three regions wherein the near-contact region is rich in both the Groups I and VI elements relative to the bulk, and wherein the near-junction region is deficient in the Group I element relative to the bulk. For a CuInSe$_2$ film, the evaporation rates for forming this film preferably are:

| | Cu evaporation rate: |
|---|---|
| first region | 1.78 × 10$^{-7}$ gm/cm$^2$*sec |
| second region: | 1.63 × 10$^{-7}$ gm/cm$^2$*sec |
| third region: | 1.10 × 10$^{-7}$ gm/cm$^2$*sec |
| | In evaporation rate: |
| All regions: | 2.83 × 10$^{-7}$ gm/cm$^2$*sec |
| | Se evaporation rate: |
| first region: | 6.2 × 10$^{-7}$ gm/cm$^2$*sec |
| second region: | 5.7 × 10$^{-7}$ gm/cm$^2$*sec |
| third region: | 5.7 × 10$^{-7}$ gm/cm$^2$*sec |

BEST MODE CONTEMPLATED FOR CARRYING OUT THE INVENTION

Figure 1:
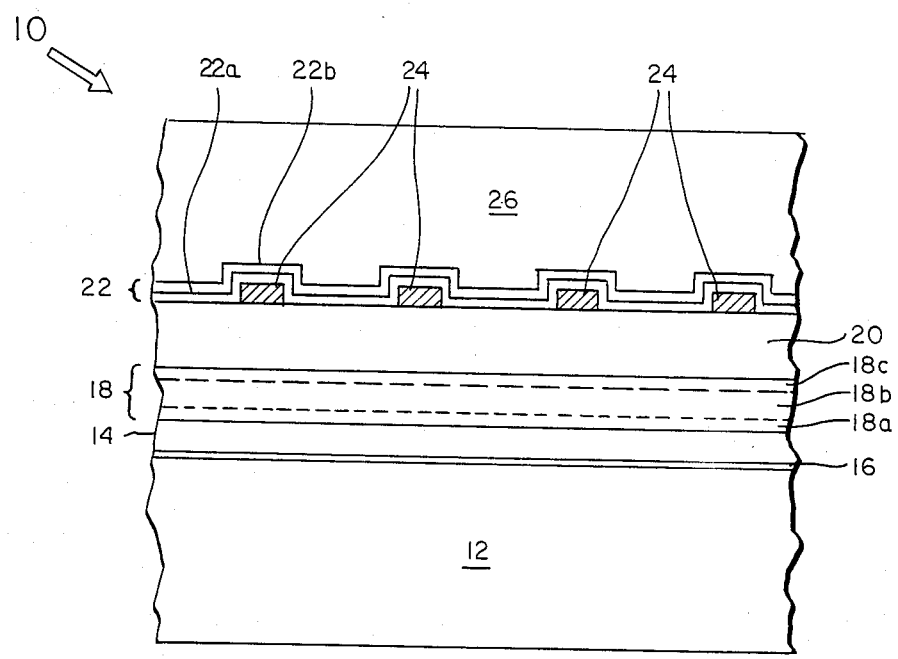
FIG. 1 is a schematic cross-sectional view of a typical semiconductor solar cell made with the method of the present invention.

The invention relates to a polycrystalline, thin film, graded I-III-IV$_2$ chalcopyrite semiconductor, and, more preferably, to a p-CuInSe$_2$/n-(Cd,Zn)S heterojunction made according to a modified Mickelsen and Chen process which is optimized, especially in formation of the I-III-VI$_2$ material, to improve the quality of the cell.

The Mickelsen and Chen method forms a graded, ternary semiconductor by sequential formation of semiconductor layers by simultaneous elemental reactive evaporation on a substrate 12. The substrate generally is selected from the group consisting of polycrystalline alumina, glazed alumina, enameled steel, metal foils, and similar inert inorganic materials. As suggested by Harry Dursch of The Boeing Company, the preferred substrate for $CuInSe_2/(Cd,Zn)S$ cells for space applications has proven to be a 2-5 mil titanium metal foil. This foil can withstand the high temperatures necessary for fabricating the cell (about 450° C. for about 20 min) without cracking, melting, softening, or distorting. When cooled, the foil retains its desirable mechanical properties. Titanium foil has a coefficient of thermal expansion that essentially matches that of the $CuInSe_2/(Cd,Zn)S$ semiconductor material of the cell ($3.0-5.0 \times 10^{-6}$ in./in./°F.). This match prevents excessive residual stresses or flaking within the cell during its cooldown to ambient temperature following the manufacturing depositions or during thermal cycling between about $-175°$ C. to 100° C., as is required by NASA and as may be experienced in space applications. No outgassing occurs from the titanium foil during deposition. Finally, the foil provides the possibility of high specific powers (watts/kg), since titanium, especially at two mils, is as light a substrate as heretofore believed possible. Specific power ratios above 300 watts/kg (and possibly as high as 500 watts/kg.) are achievable by combining an optimized $CuInSe_2/(Cd,Zn)S$ solar cell material of the present invention on a titanium foil substrate.

A base contact or metalization 14 of molybdenum is deposited by RF or DC magnetron sputtering over a $Si_3N_4$ dielectric layer 16 of insulation on the substrate 12. Of course, other metalization could be used. Then, a graded ternary layer 18 of $CuInSe_2$ is deposited by reactive evaporation. Improved semiconductors may be formed by controlling the mean free path between vapor particles in the reactor by increasing the pressure with a mixing gas (usually with hydrogen and/or oxygen) within the reactor, as described in U.S. Pat. No. 4,523,051.

The $CuInSe_2$ layer 18 can be improved, according to the present invention, by profiling the evaporation rates for Cu and Se independently throughout the deposition and particularly in three regions of the layer 18, namely: (1) in the initial deposition 18a of $CuInSe_2$ onto the contact 14, (2) in the bulk 18b of the thin film, and (3) in the region 18c near the junction of the film. The substrate temperature should also be carefully controlled throughout the deposition, as will be explained.

A high efficiency cell has been made according to the following method. As previously explained, the ratio of Cu to Se is important in tailoring the performance of the cell. Therefore, although described as the control of evaporation rates, the invention relates more generally to control of the ratios. Films of different thickness or growth rate can be formed by scaling from the rates and ratios illustrated here.

During at least the first minute of reactive evaporation at a temperature of about 355° C. and a pressure of about $3-8 \times 10^{-6}$ torr, preferably in the presence of hydrogen to promote mixing (as described in U.S. Pat. No. 4,523,051), copper, indium, and selenium are evaporated so that the fluxes of each material at the substrate (or onto the growing film) are as follows:

| Material | Flux (gm/cm$^2$*sec) |
|---|---|
| Copper | $1.64 \times 10^{-7}$ |
| Indium | $2.83 \times 10^{-7}$ |
| Selenium | $6.2 \times 10^{-7}$ |

During this first minute of deposition, the first region 18a of the $CuInSe_2$ thin film is deposited.

After this initial deposition period, the fluxes of the materials are adjusted, and the bulk region 18b of the film is deposited for at least about 25 minutes. The fluxes for depositing the second region 18b are as follows:

| Material | Flux (gm/cm$^2$*sec) |
|---|---|
| Copper | $1.64 \times 10^{-7}$ |
| Indium | $2.83 \times 10^{-7}$ |
| Selenium | $5.7 \times 10^{-7}$ |

Accordingly, the bulk may be depleted in selenium over that concentration found adjacent the base contact 14 in the first region 18a, but is slightly rich in Cu to produce a p-type material. The evaporation preferably occurs under identical temperature and pressure conditions for the bulk region 18b as for the first region 18a.

The third region 18c is deposited by altering the Cu flux and the substrate temperature. Initially, the substrate is maintained at about 355° C., but after one minute of evaporation during formation of the third region 18c (or 27 minutes after beginning the deposition), the temperature is increased. For three minutes, the reactor temperature is increased linearly at a rate of about 33.3° C./min until the temperature is about 455° C. Then, heating stops and the substrate is maintained at about 455° C. until the deposition is complete. The entire period for depositing the third region 18c is about 14 minutes: one minute at 355° C., three minutes of heating to 455° C., and 10 minutes at 455° C.

At the beginning of the period for depositing the third region 18c, the fluxes are adjusted as follows:

| Material | Flux (gm/cm$^2$*sec) |
|---|---|
| Copper | $1.10 \times 10^{-7}$ |
| Indium | $2.83 \times 10^{-7}$ |
| Selenium | $5.7 \times 10^{-7}$ |

Accordingly, the third region 18c is slightly deficient in copper over the bulk region 18b of the film and has a higher resistivity near the junction, thereby forming a p-n type transient homojunction within the $CuInSe_2$. This third region 18C may actually be an essentially intrinsic (i) region. For purposes of this description, then, the term "p-n-type transient homojunction" shall be understood to include a (p-i-n) type junction.

While a preferred temperature profile has been described, other profiles are believed to be applicable for successfully depositing the film so that the resulting cell has improved conversion efficiency. The preferred profile described here has been used to make cells reproducibly and has resulted in cells having efficiencies as high as 10.4% AM0 and 11.9% AM1. Apparently the major improvement in the cell comes from the control of the fluxes of each element during the deposition and from the altered profile for forming the cell.

The fluxes are changed nearly instantaneously by adjusting the respective rate contollers for the evaporation of Cu and Se. The preferred Cu and In controller is a standard Inficon Sentinel 200 controller, and that for Se is an Airco Temescal Quartz Crystal Rate Controller. Both controllers allow the evaporation rates to be changed accurately within about a 5 second span.

While CuInSe$_2$ is preferred for the base of the heterojunction, other materials on the I-III-IV$_2$ chalcopyrite semiconductor family might be used, such as a thin-film A-B-type heterojunction where "A" and "B" are selected from the group of semiconductor materials consisting of:

| A | and | B |
|---|---|---|
| (i) a p-type ternary material | and | an n-type material; |
| (ii) an n-type ternary material | and | a p-type material; |
| (iii) an n-type material | and | a p-type ternary material; |
| (iv) a p-type material | and | an n-type ternary material. |

Compounds of this family include AgInS$_2$, AgGaSe$_2$, AgGaTe$_2$, AgInSe$_2$, CuGaTe$_2$, AgInTe$_2$, or CuGaS$_2$. CuInSe$_2$ is preferred for solar cell applications.

The preferred cell 10 is completed by depositing a (Cd,Zn)S layer 20 on the CuInSe$_2$ layer 18 to form a heterojunction, as explained in the Mickelsen and Chen patents previously identified. The resulting cell 10 is a low-cost, polycrystalline transducer having an efficiency above 10% AMO. When prepared according to the improved method on an alumina substrate with antireflection coatings 22, and aluminum grid contacts 24, as shown in FIG. 1, the cell efficiency has been measured as high as 10.4% AMO (a 10% increase over earlier CuInSe$_2$ cells) and 11.9% AM1. In completed cells, FEP-Teflon and/or glass cover layers 26 may be used, as shown in FIG. 1.

The (Zn,Cd)S layer 20 has an optimum composition of 0.20+/−0.05 mol% Zn to 0.80+/−0.05 mol % Cd (i.e. Zn$_{0.2}$Cd$_{0.8}$S). Indium doping of this (Zn,Cd)S film 20 should be controlled to maintain the resistive losses (or the sheet resistance) below that of the associated grid metalization 24. Generally, the first portion of the (Zn,Cd)S layer 20 (about the first 0.4 micrometers of a 3.0 micrometer thin film 20) is free of indium doping. Thereafter, the remaining portion of layer 20 includes sufficient indium so that the sheet resistance of the layer is about 20-25 ohms/square.

The highest conversion efficiencies were achieved when the deposition of the (Zn,Cd)S atop the CuInSe$_2$ was delayed for several days after depositing the CuInSe$_2$, although it is not believed that a delay is necessary to make the highest efficiency cells. The partially completed cells were removed from the reactor and stored at ambient conditions for about 6 days prior to depositing the (Zn,Cd)S layer 20. Our tests show that no harm results from such a delay, thereby allowing greater flexibility in the production process.

The composition of the (Zn,Cd)S layer 20 is controlled by monitoring the evaporation rates of ZnS and CdS from closed bottle-type sources contained in furnaces and by controlling the temperature. Typically the substrate is maintained at a temperature of about 200° C. throughout formation of this layer 20.

Improvements in the conversion efficiency for the completed cell are also achieved by controlling the deposition of the grid metalization 24 so as to eliminate grid resistive losses. For an aluminum grid as used on the preferred CuInSe$_2$/(Zn,Cd)S cells of the present invention, the grid should be uniformly thick, about 5.0+/−0.5 micrometers thick, deposited in a vacuum through an aperture mask Usually two antireflection coatings 22a and 22b are deposited atop the (Zn,Cd)S layer 20 and metalization 24. A nonstoichiometric layer 22a of SiO$_x$ having a thickness of about 0.106 micrometer is applied directly to the sulfide layer 20, and a 0.082 micrometer layer 22b of MgF$_2$ is applied atop the SiO$_x$. The SiO$_x$ layer 22a is selected to yield a non-optically absorbing layer having an optical index of refraction of about 1.73.

While the highest conversion efficiencies have been achieved with the method described above (where the thin film has a selenium-rich, near-contact region, a bulk region, and a copper-deficient, near-junction region), films of higher efficiency than those previously described in the literature have also been produced by forming a three region film having a selenium-and-copper-rich, near-contact region, a bulk region, and a copper-deficient, near-junction region. For example, the fluxes used to prepare this copper-rich/copper-deficient thin film were:

| | Cu evaporation rate: |
|---|---|
| first region | 1.78 × 10$^{-7}$ gm/cm$^2$*sec |
| second region: | 1.63 × 10$^{-7}$ gm/cm$^2$*sec |
| third region: | 1.10 × 10$^{-7}$ gm/cm$^2$*sec |
| | In evaporation rate: |
| All regions: | 2.83 × 10$^{-7}$ gm/cm$^2$*sec |
| | Se evaporation rate: |
| first region: | 6.2 × 10$^{-7}$ gm/cm$^2$*sec |
| second region: | 5.7 × 10$^{-7}$ gm/cm$^2$*sec |
| third region: | 5.7 × 10$^{-7}$ gm/cm$^2$*sec |

Near optimum cell performance (although slightly less efficient than the selenium-rich cell) was achieved. By comparison of these fluxes to those of the preferred method, it can be seen that the near-contact region is rich in both copper and selenium relative to the bulk region, and that both fluxes are reduced when depositing the bulk region.

While preferred embodiments have been shown and described, those skilled in the art will readily recognize alterations, variations, or modifications that might be made to the particular embodiments that have been described without departing from the inventive concept. This description and the drawings are intended to illustrate the invention, and not to limit it, unless such limitation is necessary in view of the pertinent prior art. Accordingly, the claims should be interpreted liberally in view of this description to protect the preferred embodiments of the invention that have been described and all reasonable equivalents. The claims should only be limited as is necessary in view of the pertinent prior art.

I claim:

1. A method for making a graded, I-III-VI$_2$ semiconductor in a reactor by the simultaneous elemental evaporation of the Groups I, III, and VI elements onto a base contact deposited on a suitable substrate, the semiconductor having a near-contact region, a bulk region, and a near-junction region, the method comprising the steps of:

(a) depositing the near-contact region on the base contact at predetermined fluxes for the elements;

(b) adjusting the fluxes relative to one another to deposit a p-type bulk region atop the near-contact region, the concentration of the Group VI element in the bulk region being less than the concentration of the Group VI element in the near-contact region;

(c) adjusting the fluxes relative to one another to deposit the near-junction region atop the bulk region, the concentration of the Group I element in the near-junction region being less than the concentration of the Group I element in the bulk region, and being sufficiently reduced to establish a p-n type transient homojunction within the semiconductor.

2. The method of claim 1 wherein the step of adjusting the fluxes in step (b) includes reducing the flux of the Group VI element while maintaining the fluxes of the Groups I and III elements relatively constant.

3. The method of claim 2 wherein the step of adjusting the fluxes in step (c) includes reducing the flux of the Group I element while maintaining the fluxes of the Groups III and VI elements relatively constant.

4. The method of claim 3 wherein the temperature of the substrate is altered during step (c) to raise the temperature from a first predetermined temperature that is maintained relatively constant during steps (a) and (b) to a second, higher, predetermined temperature.

5. The method of claim 4 wherein the temperature profile during step (c) includes three periods: a first period during which the tepmerature is maintained substantially at the first predetermined temperature, a second period during which the temperature is raised smoothly from the first temperature to the second temperature, and a third period during which the temperature is maintained substantially at the second temperature.

6. The method of claim 5 wherein the flux of the Group I element is reduced during the first period of the temperature profile.

7. The method of claim 6 wherein the semiconductor is a thin film of $CuInSe_2$, and wherein the fluxes of the elements during steps (a), (b), and (c) are about:

| Step | Element | Flux (gm/cm$^2$*sec) |
| --- | --- | --- |
| (a) | Copper | $1.64 \times 10^{-7}$ |
| | Indium | $2.83 \times 10^{-7}$ |
| | Selenium | $6.2 \times 10^{-7}$ |
| (b) | Copper | $1.64 \times 10^{-7}$ |
| | Indium | $2.83 \times 10^{-7}$ |
| | Selenium | $5.7 \times 10^{-7}$ |
| (c) | Copper | $1.10 \times 10^{-7}$ |
| | Indium | $2.83 \times 10^{-7}$ |
| | Selenium | $5.7 \times 10^{-7}$ |

8. The product of the process of claim 7.

9. The method of claim 7 wherein the first temperature is about 355° C.

10. The method of claim 9 wherein the second temperature is about 455° C.

11. The method of claim 10 wherein the temperature is raised during the second period at a substantially constant rate.

12. The method of claim 11 wherein the rate is about 33.3° C./min.

13. The method of claim 12 wherein step (a) occurs for about 1 minute, step (b) occurs for about 25 minutes, and step (c) occurs for about 14 minutes.

14. The method of claim 13 wherein the first period of step (c) is about one minute.

15. The method of claim 14 wherein the pressure of the reactor is between about $3-8 \times 10^{-6}$ torr and wherein sufficient mixing gas is present in the reactor to promote mixing of the elemental vapors by reducing the mean free path.

16. The product of the process of claim 14.

17. The method of claim 3 wherein the semiconductor is a thin film of $CuInSe_2$.

18. The method of claim 17 wherein the fluxes of the elements during steps (a), (b), and (c) are about:

| Step | Element | Flux (gm/cm$^2$*sec) |
| --- | --- | --- |
| (a) | Copper | $1.64 \times 10^{-7}$ |
| | Indium | $2.83 \times 10^{-7}$ |
| | Selenium | $6.2 \times 10^{-7}$ |
| (b) | Copper | $1.64 \times 10^{-7}$ |
| | Indium | $2.83 \times 10^{-7}$ |
| | Selenium | $5.7 \times 10^{-7}$ |
| (c) | Copper | $1.10 \times 10^{-7}$ |
| | Indium | $2.83 \times 10^{-7}$ |
| | Selenium | $5.7 \times 10^{-7}$ |

19. The method of claim 17 wherein the ratio of the fluxes of copper:indium:selenium during steps (a), (b), and (c) is about as follows:

| Step | Copper:Indium:Selenium |
| --- | --- |
| (a) | 1.64:2.83:6.2 |
| (b) | 1.64:2.83:5.7 |
| (c) | 1.10:2.83:5.7 |

20. The method of claim 1 wherein the step of adjusting the fluxes in step (c) includes reducing the flux of the Group I element while maintaining the fluxes of the Groups III and VI elements relatively constant.

21. The method of claim 1 wherein the temperature of the substrate is maintained relatively constant during steps (a) and (b) and is increased during step (c).

22. The method of claim 21 wherein the temperature profile during step (c) includes three periods, a first period during which the temperature is substantially constant with that of steps (a) and (b), a second period during which the temperature is being increased smoothly at a predetermined rate, and a third peiod during which the temperature is maintained relatively constant at a predetermined, higher temperature.

23. The method of claim 21 wherein the temperature during the second period is increased at a constant rate so that the temperature rise is substantially linear.

24. The method of claim 1 wherein the semiconductor is a thin film of $CuInSe_2$.

25. The method of claim 24 wherein the fluxes of the elements during step (a) are about:

| Element | Flux (gm/cm$^2$*sec) |
| --- | --- |
| Copper | $1.64 \times 10^{-7}$ |
| Indium | $2.83 \times 10^{-7}$ |
| Selenium | $6.2 \times 10^{-7}$ |

26. The method of claim 24 wherein the fluxes of the elements during step (b) are about:

| Element | Flux (gm/cm²*sec) |
|---|---|
| Copper | 1.64 × 10⁻⁷ |
| Indium | 2.83 × 10⁻⁷ |
| Selenium | 5.7 × 10⁻⁷ |

27. The method of claim 24 wherein the fluxes of the elements during step (c) are about:

| Element | Flux (gm/cm²*sec) |
|---|---|
| Copper | 1.10 × 10⁻⁷ |
| Indium | 2.83 × 10⁻⁷ |
| Selenium | 5.7 × 10⁻⁷ |

28. The method of claim 24 wherein the ratio of the fluxes of copper:indium:selenium is about 1.64:2.83:6.2 during step (a).

29. The method of claim 24 wherein the ratio of the fluxes of copper:indium:selenium is about 1.64:2.83:5.7 during step (b).

30. The method of claim 24 wherein the ratio of the fluxes of copper:indium:selenium is about 1.10:2.83:5.7 during step (c).

31. The method of claim 24 wherein the ratio of the fluxes of copper:selenium during steps (a), (b), and (c) is about as follows:

| Step | Copper:Selenium |
|---|---|
| (a) | 1.64:6.2 |
| (b) | 1.64:5.7 |
| (c) | 1.10:5.7 |

32. The method of claim 24 wherein the ratio of the fluxes of copper:indium:selenium during step (a) is about 1.78:2.83:6.2.

33. The method of claim 32 wherein the ratio of the fluxes of copper:indium:selenium during step (b) is about 1.63:2.83:5.7.

34. The method of claim 33 wherein the ratio of the fluxes of copper:indium:selenium during step (c) is about 1.10:2.83:5.7.

35. The method of claim 24 wherein the ratio of the fluxes of copper:selenium during step (a) is about 1.78:6.2 and during step (b) is about 1.63:5.7.

36. The method of claim 1 wherein the step (b) of adjusting the fluxes to deposit the p-type bulk region includes adjusting the Group I element:Group VI element flux ratio from about 1.0:3.78 to about 1.0:3.475.

37. The method of claim 36 wherein the step (c) of adjusting the fluxes to deposit the near-junction region includes adjusting the Group I element:Group VI element flux ratio from about 1.0:3.475 to about 1.0:5.18.

38. The method of claim 1 wherein the pressure of the reactor is between about 3–8×10⁻⁶ torr, and wherein sufficient mixing gas is present in the reactor to promote mixing of the elemental vapors by reducing the mean free path.

39. The product of the process of claim 1.

40. The method of claim 1 wherein the step of adjusting the fluxes in step (b) includes reducing the flux of the Groups I and VI elements, while maintaining the flux of the Group III element relatively constant.

41. A method for making a graded, CuInSe₂ thin film semiconductor in a reactor by the simultaneous elemental evaporation of the elements onto a base contact deposited on a suitable substrate, the semiconductor having a near-contact region, a bulk region, and a near-junction region, the method comprising the steps of:

(a) creating the near-contact region of the semiconductor by depositing the elements on the base contact for about one minute at about the following fluxes:

| Element | Flux (gm/cm²*sec) |
|---|---|
| Copper | 1.64 × 10⁻⁷ |
| Indium | 2.83 × 10⁻⁷ |
| Selenium | 6.2 × 10⁻⁷ | at a substrate temperature of about 355° C. and a pressure of between about 3–8×10⁻⁶ torr in the presence of sufficient mixing gas to promote mixing of the elemental vapors;

(b) adjusting the flux of selenium from 6.2×10⁻⁷ gm/cm²*sec to about 5.7×10⁻⁷ gm/cm²*sec;

(c) continuing the deposition for about 25 minutes to create a p-type bulk region of the semiconductor slighty rich in copper;

(d) adjusting the flux of copper from 1.64×10⁻⁷ gm/cm²*sec to about 1.10×10⁻⁷ gm/cm²*sec;

(e) continuing the deposition for about 14 minutes to create the near-junction region of the semiconductor, the near-junction region being deficient in copper sufficiently to create a p-n type transient homojunction; and (f) adjusting the temperature of the substrate during deposition of the near-junction region by increasing the temperature smoothly from about 355° C. to about 455° C. after completing the adjustment in the copper flux.

42. A method for making a CuInSe₂/(Zn,Cd)S solar cell having a conversion efficiency of at least about 10.4% AMO, comprising the steps of:

(a) depositing a polycrystalline thin film of graded CuInSe₂ on a base contact deposited on a suitable substrate, the thin film including three regions, a near-contact region rich in selenium, a bulk region over the near-contact region and slightly rich in copper, and a near-junction region at least slightly deficient in copper so as to form a p-n type transient homojunction;

(b) depositing a (Zn,Cd)S thin film atop the near-junction region of the CuInSe₂ to define a heterojunction, the (Zn,Cd)S being doped with a suitable dopant in the region away from the heterojunction so that the (Zn,Cd)S thin film has a sheet resistance less than that of grid metalization of the cell; and (c) depositing grid metalization atop the (Zn,Cd)S of sufficient thickness to eliminate grid resistive losses.

43. The method of claim 42 wherein the metalization is aluminum having a thickness of about 5.0+/−0.5 micrometers.

44. The method of claim 42 wherein the (Zn,Cd)S has a composition of about (Zn₀.₂Cd₀.₈)S.

45. The method of claim 42 wherein the near-contact region and bulk region are deposited at a substrate temperature of about 355° C. and the near-junction region is deposited with a temperature profile that includes a transition region for smoothly raising the temperature from 355° C. to about 455° C.

46. The method of claim 45 wherein the substrate temperature during deposition of the (Zn,Cd)S thin film is about 200° C.

47. The method of claim 42 further comprising the steps of:
(a) removing the substrate from the reactor after depositing the CuInSe$_2$ thin film; and
(b) storing that film at ambient temperature and pressure in air for a predetermined time prior to depositing the (Zn,Cd)S thin film on the CuInSe$_2$.

48. The method of claim 42 further comprising the step of:
depositing at least one antireflection coating atop the (Zn,Cd)S after applying the metalization.

49. The method of claim 42 further comprising the steps of:
(a) depositing a first antireflection coating of SiO$_x$ atop the (Zn,Cd)S thin film after applying the metalization; and
(b) depositing a second antireflection coating of MgF$_2$ atop the SiO$_x$, wherein the SiO$_x$ layer is selected to have an optical index of refraction of about 1.73.

50. A method for making CuInSe$_2$/(Zn,CD)S thin film solar cell having a conversion efficiency of at least about 10.4% AMO, comprising the steps of:
(a) depositing a selenium-rich near-contact region of a thin film, polycrystalline CuInSe$_2$ semiconductor on a suitable base contact atop a suitable substrate by simultaneous elemental reactive evaporation at a temperature of about 355° C. and a pressure of about 3–8×10$^{-6}$ torr in the presence of sufficient mixing gas to promote mixing of the elemental vapors, the deposition occurring for a least about one minute at substantially the following fluxes:

| Element | Flux (gm/cm$^{2*}$sec) |
|---------|------------------------|
| Copper | 1.64 × 10$^{-7}$ |
| Indium | 2.83 × 10$^{-7}$ |
| Selenium | 6.2 × 10$^{-7}$; |

(b) depositing a bulk region of the CuInSe$_2$ semiconductor atop the near-contact region by reducing the flux of selenium to about 5.7×10$^{-7}$ gm/cm$^{2*}$sec while holding the other conditions substantially constant, the deposition continuing for at least about 25 minutes;
(c) depositing a near-junction region of the CuInSe$_2$ semiconductor atop the bulk region by reducing the flux of copper to about 1.10×10$^{-7}$ gm/cm$_2$*sec, the deposition continuing for about 14 minutes, the temperature of the substrate being changed during the deposition such that the temperature is raised smoothly from 355° C. to 455° C. during the early portion of the deposition and is maintained at substantially 455° C. during the majority of the deposition period for the near-junction region, the semiconductor being a p-n type transient homojunction;
(d) depositing a (Zn,Cd)S thin film atop the CuInSe$_2$ semiconductor to define a heterojunction, the (Zn,Cd)S thin film being deposited by simultaneous reactive evaporation of the compounds ZnS and CdS upon the partially completed cell maintained at a temperature of about 200° C.;
(e) doping the (Zn,Cd)S thin film away from the junction with sufficient indium to provide a sheet resistance of the (Zn,Cd)S thin film of between about 20–25 ohm/cm$^2$, the indium being introduced to the reactor during the deposition of step (d);
(f) applying grid metalization to the (Zn,Cd)S thin film, the metalization having a resistance of at least 20–25 ohm/square;
(g) applying at least one antireflection coating atop the (Zn,Cd)S after applying the grid metalization.

51. The method of claim 50 wherein the temperature of the substrate is changed during step (c) at a substantially constant rate of about 33.3° C./min and wherein two antireflection coatings are applied, the first coating comprising a layer of SiO$_x$ having an optical index of refraction of about 1.73, the second coating comprising MgF$_2$, the MgF$_2$ being applied atop the SiO$_x$.

52. The solar cell made by the process of claim 51.

53. A method for enhancing the conversion efficiency of a CuInSe$_2$ semiconductor, comprising the step of:
preparing a graded, polycrystalline thin film of CuInSe$_2$ by simultaneous reactive evaporation so that the thin film includes a selenium-rich, near-contact region, a bulk region, and a copper-deficient, near-junction region, the copper-deficient region defining a p-n type transient homojunction within the thin film.

54. A method for enhancing the conversion efficiency of a CuInSe$_2$/(Zn,Cd)S solar cell, comprising the step of:
maintaining the sheet resistance of the (Zn,Cd)S layer at less than the resistance of metalization atop the (Zn,Cd)S.

55. A solar cell having a conversion efficiency of at least about 10.4% AMO, comprising:
(a) a substrate;
(b) a base contact on the substrate;
(c) a polycrystalline, thin film CuInSe$_2$ semiconductor deposited on the contact and including a near-contact region rich in selenium, a p-type bulk region, and a near-junction region defining a p-n type transient homojunction in the semiconductor;
(d) a (Zn$_{0.2}$Cd$_{0.8}$)S thin film deposited atop the CuInse$_2$ semiconductor to define a heterojunction, the film including sufficient indium doping in the region away from the heterojunction to provide a sheet resistance of the film of between about 20–25 ohm/square;
(e) aluminum grid metalization atop the (Zn$_{0.2}$Cd$_{0.8}$)S thin film, the metalization being sufficiently thick to eliminate grid resistance losses;
(f) a SiO$_x$ antireflection coating atop the (Zn$_{0.2}$Cd$_{0.8}$)S thin film and metalization, the SiO$_x$ having an optical index of refraction of about 1.73; and
(g) a MgF$_2$ antireflection coating atop the SiO$_x$.

56. The solar cell of claim 55 wherein the substrate is alumina.

57. The solar cell of claim 55 wherein the substrate is titanium foil, and wherein the cell further comprises a dielectric, insulative layer between the foil and base contact.

58. The solar cell of claim 57 wherein the insulative layer is Si$_3$N$_4$, the aluminum grid metalization has a thickness of 5.0+/−0.5 micrometers, the SiO$_x$ layer is about 0.106 micrometer thick, and the Mgf$_2$ layer is about 0.082 micrometer thick.

59. The solar cell of claim 58 further comprising a cover layer atop the MgF$_2$ antireflection coating.

60. A method for enhancing the conversion efficiency of a CuInSe$_2$ semiconductor, comprising the step of:

preparing a graded, polycrystalline thin film of CuInSe$_2$ by simultaneous reactive evaporation so that the thin-film includes a copper-rich, near-contact region, a bulk region, and a copper-deficient, near-junction region, the copper-deficient region defining a p-n type transient homojunction within the thin film.

* * * * *